United States Patent [19]

Dalton, Jr. et al.

[11] 4,409,727

[45] Oct. 18, 1983

[54] METHODS OF MAKING NARROW CHANNEL FIELD EFFECT TRANSISTORS

[75] Inventors: Philip A. Dalton, Jr., Kettering, Ohio; Lowell C. Bergstedt, San Francisco, Calif.

[73] Assignee: NCR Corporation, Dayton, Ohio

[21] Appl. No.: 425,770

[22] Filed: Sep. 28, 1982

Related U.S. Application Data

[62] Division of Ser. No. 94,121, Nov. 14, 1979, abandoned.

[51] Int. Cl.³ .................. H01L 21/223; H01L 21/265
[52] U.S. Cl. .................................... 29/571; 29/576 B; 29/578; 148/187; 148/189
[58] Field of Search ................ 29/571, 576 B, 578; 148/187, 189

[56] References Cited

U.S. PATENT DOCUMENTS

| 3,401,349 | 9/1968 | Mitchell | 357/41 |
| 4,026,740 | 5/1977 | Owen | 148/187 X |
| 4,040,168 | 8/1977 | Huang | 29/571 |
| 4,085,498 | 4/1978 | Rideout | 29/577 R X |
| 4,124,826 | 11/1978 | Dixon et al. | 148/187 X |
| 4,124,933 | 11/1978 | Nicholas | 148/187 X |
| 4,145,233 | 3/1979 | Setick et al. | 148/187 X |
| 4,212,683 | 7/1980 | Jones et al. | 148/187 X |

*Primary Examiner*—G. Ozaki
*Attorney, Agent, or Firm*—J. T. Cavender; Philip A. Dalton, Jr.

[57] ABSTRACT

A pair of narrow channel IGFET devices having separate insulated gate electrode structures formed over narrow channel regions of a substrate flanking a central enhancement region. Methods of forming the narrow channel regions using a single photolithography step and forming separate gate electrode structures overlying each using alternative processes, each generally involving two photolithography steps, are set forth.

5 Claims, 41 Drawing Figures

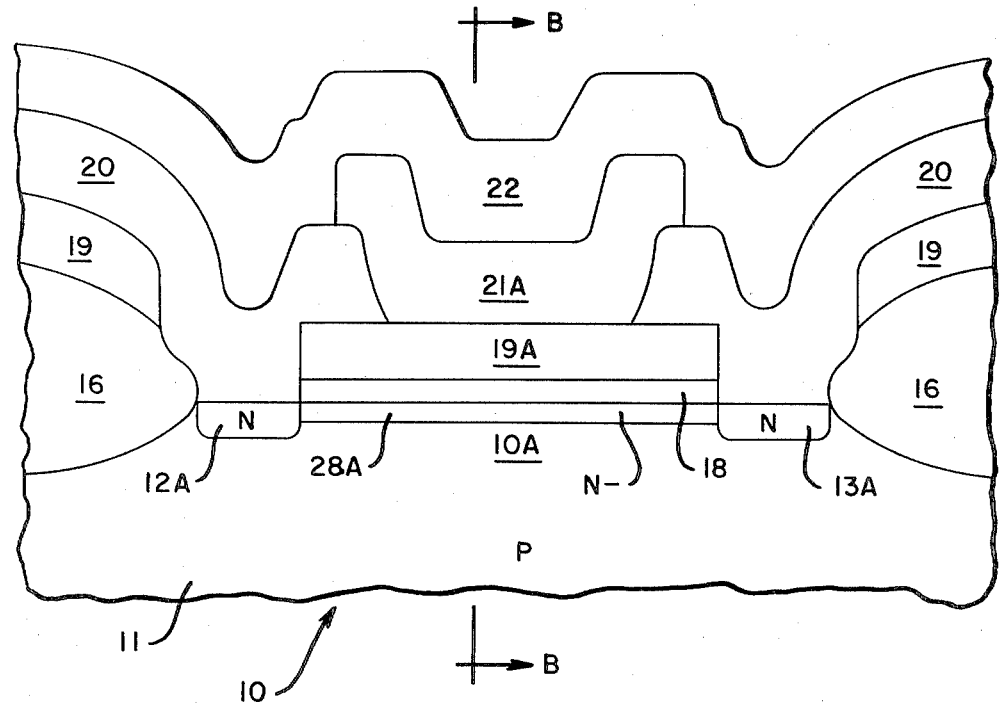

METHODS OF MAKING NARROW CHANNEL FIELD EFFECT TRANSISTORS

This application is a division of application Ser. No. 094,121, filed Nov. 14, 1979, and now abandoned.

BACKGROUND OF THE INVENTION

This invention relates generally to field effect semiconductor devices and methods for making such devices. More particularly this invention relates to narrow channel, low current field effect transistors (FETs) and methods for making such transistors.

Currently there is considerable research and development activity in the semiconductor industry directed toward insulated gate field effect transistors (IGFETs). One current thrust of developments in this area is to form larger numbers of IGFET devices on each semiconductor integrated circuit (IC) chip. Obviously, to form more IGFET devices per unit of chip area it is necessary to shrink the size of each device. To shrink the size of an IGFET device, it is necessary to reduce either the width or the length of each device or, preferably, both. All other parameters being equal, the drain-to-source current of a field effect transistor is proportional to the width-to-length ratio (W/L) of the device channel. Accordingly, if the channel length of IGFET devices alone is reduced to enable more devices per unit area to be formed, the amount of current drawn by each device increases. Correspondingly, the overall power dissipation of an integrated circuit chip incorporating a larger number of such shorter channel devices goes up dramatically. Thus, the semiconductor technologist faces the problem of dealing with increased power dissipation if he reduces the size of his IGFET devices by shrinking only the channel length.

Power dissipation per device can be kept constant by shrinking the width of the device in the same ratio as the length of the device. However, the lower limit on channel width is conventionally determined by the resolution of the lithography technique employed in fabricating the device. While highly sophisticated new methods of lithography, using electron beams and x-rays in order to achieve smaller device dimensions, are being developed, the equipment required is very expensive, especially if high volume production is desired. Consequently, the majority of ICs today are still being manufactured using conventional photolithography with ultraviolet-sensitive photoresists and contact or projection photomask aligning equipment. Typically, the limit of resolution of such conventional photolithography is in the vicinity of about three microns, with a maximum mask alignment error of about one micron.

Jones and Van Velthoven patent application Ser. No. 890,425, filed Mar. 27, 1978 now U.S. Pat. No. 4,212,638, and assigned to NCR Corporation discloses a method of fabricating low current depletion load devices (or other IGFET devices types) involving narrow (approximately 0.1 micron) device channels. For purposes of this discussion, the term "narrow" will be used to denote a width which is substantially less than the minimum photolithographic feature size (e.g. the three microns mentioned above). The method taught in the Jones et al. patent essentially comprises the formation of a window or well in an oxide masking structure formed on the semiconductor substrate, performing an enhancement implant in the substrate region in the well, enlarging the well by etching the oxide a controlled amount to expose a narrow region of the substrate around the periphery of the implanted enhancement section, performing a depletion implant in the substrate to form narrow depletion channel regions flanking the central enhancement channel region, and then forming a single conductor-insulator gate structure over both the narrow channel regions and the central channel region. The two narrow channel regions (0.1 micron combined width) form a depletion device with an effective channel width substantially less than the minimum photolithographic feature size of about three microns. Using other implant-type combinations, other combinations of enhancement and/or depletion channel devices are possible using the Jones et al. approach.

Sefick and Jones U.S. Pat. No. 4,145,233, issued Mar. 20, 1979 to NCR Corporation discloses an alternative method for forming the same type of low current IGFET device as taught in the Jones et al. patent referred to above. The method disclosed in the Sefick et al. patent is the formation of a photoresist mask on a masking oxide layer disposed on the semiconductor substrate; overetching the oxide under the photoresist mask to produce an oxide mask aperture larger than the photoresist mask aperture; forming the central enhancement section by ion implantation through the photoresist mask aperture; removing the photoresist mask and performing a second ion implantation through the slightly larger oxide mask aperture to form narrow depletion channel regions flanking the central enhancement channel region; and then forming a single conductor-insulator gate structure over both narrow channel regions and the central channel region.

SUMMARY OF THE INVENTION

The present invention generally constitutes an improvement over the structures and methods taught in the above-mentioned Jones et al. patent and the Sefick et al. patent by providing for the formation of a pair of narrow channel CIS devices within an area of an IC chip of substantially lesser width than that required to form two CIS devices in accordance with either of the two prior art approaches. In accordance with this invention one device is formed over each of the narrow channel regions flanking a central enhancement section which are formed in the semiconductor substrate in accordance with either of the prior art methods.

More specifically, in accordance with this invention a pair of CIS devices is formed on a semiconductor substrate with the pair of devices comprising a doped region formed in the substrate, narrow device channel regions formed on opposite sides of the doped region, and separate conductor-insulator gate structures formed on the substrate overlying the narrow channel regions. For CIS devices of the transistor type, the invention further comprises source and drain regions formed in the substrate at the ends of the narrow channel regions. The CIS devices may either be depletion devices or enhancement devices depending on whether the narrow channel regions are provided with a depletion threshold or enhancement threshold utilizing appropriate conductivity-modifying dopants as necessary.

In accordance with another aspect of this invention, a method of forming a pair of narrow channel CIS devices on a semiconductor substrate is provided. This method involves generally forming in a substrate of selected conductivity-type a pair of narrow channel regions on opposite sides of a central region doped with impurities of the selected conductivity-type and forming on the substrate a pair of separate conductor-insulator gate structures each overlying one of the narrow channel regions. The first step in this method can be performed utilizing any of the techniques disclosed in the prior art discussed above.

The method of this invention requires two photolithography steps in forming the separate gate structures over the two narrow channel regions. This is one more such step than is required in a corresponding process utilizing the prior art methods detailed above. However, the method of this invention also enables the formation of a pair of CIS devices within a substantially smaller overall width of the IC substrate than is attainable with the prior art methods. This can be seen from the comparisons shown in FIGS. 1A, 1B, and 1C of the attached drawings.

FIGS. 1A and 1B show a comparison between the overall chip real estate consumed by two devices formed in accordance with either of the prior art Jones et al. or Sefick et al. approaches (FIG. 1A) and a pair of devices formed in accordance with one aspect of this invention (FIG. 1B). In FIGS. 1A and 1B the assumption is that conventional photolithography and processing is employed to form the gate electrodes. FIG. 1C, discussed later, illustrates the device geometry which may be achieved by using a special process which circumvents conventional photolithography constraints to produce an even smaller overall geometry. In making this comparison the assumption will be that the minimum photolithographic feature size is three microns and the maximum mask alignment error is one micron.

Consider first the prior art shown in FIG. 1A. Two low current devices 100 and 110 are shown formed side-by-side. The channel region only of each device is shown. Device 100 has a pair of low current channel regions 101 and 102 shown in dashed lines and a conductive gate electrode 103 covering both channels. Device 110 has two low current channels 111 and 112 and a conductive gate electrode 113 covering both channels. In accordance with the assumptions concerning photolithography, the spacing between the two narrow channel regions of both devices 100 and 110 is shown to be three microns apart. Also the conductive gate electrodes 103 and 113 are shown to be the minimum of three microns apart. Because of the one micron possible alignment error, the width of the gate electrodes 103 and 113 must be about five microns to assure that complete coverage of the two narrow channel regions is provided in each device. Accordingly the overall dimensional width of the two devices 100 and 110 comprises thirteen microns.

Referring to FIG. 1B, two devices 120 and 130 are shown as formed in accordance with the present invention. Device 120 has a single narrow channel region 121 covered by a conductive gate electrode 122. Device 130 has a single narrow channel region 131 covered by conductive gate electrode 132. Applying the same assumptions concerning photolithography as were applied to the devices depicted in FIG. 1A, again the two conductive gate electrodes are spaced by three microns and each conductive gate electrode is itself three microns wide. These dimensions dictate the overall width of the two transistor pair, giving it an overall width of nine microns. It turns out then that the two narrow channel regions 121 and 131 must be formed about six microns apart in order to insure coverage thereof by their respective gate electrodes 122 and 132. The nine micron width of the two devices depicted in FIG. 1B compares favorably with the thirteen micron width of the two prior art devices depicted in FIG. 1A.

Referring to FIG. 1C, two devices 140 and 150 are shown as formed in accordance with an alternative aspect of the present invention. Utilizing a special prior art technique for forming two closely spaced narrow gate electrodes 142 and 152, a pair of narrow channel devices can be built within a six micron overall width. In this instance the two narrow channel regions 141 and 151 are spaced by only four microns, which spacing is well within the conventional photolithographic feature size. The special process which will be discussed in detail below enables the formation of separate gates two microns wide separated by two microns but overlying the narrow channel regions. This special approach involves some additional process complexity; but, as demonstrated by comparison with both FIG. 1A and FIG. 1B, a pair of devices within a very narrow region of a semiconductor substrate is produced.

From this illustration is is apparent that while this invention involves some additional process complexity over that of the prior art, it enables IGFET devices of smaller overall dimensions to be formed. It thus permits a substantial increase in device density on an IC chip while maintaining low power dissipation due to the narrow channel, low current characteristics.

Other features and advantages of this invention will be apparent from a consideration of the following detailed specification in conjunction with the attached drawings.

BRIEF DESCRIPTION OF THE DRAWINGS

FIG. 1A is a schematic diagram of the geometry of a pair of low current IGFET devices formed in accordance with prior art techniques.

FIGS. 1B and 1C are schematic diagrams of the geometries of pairs of low current IGFET devices formed in accordance with this invention utilizing alternative methods.

FIGS. 2A and 2B are mutually orthogonal cross-sectional representations of insulated gate field effect transistors incorporating the structure of this invention.

FIGS. 3A–11A and FIGS. 3B–11B are mutually orthogonal cross-sectional representations of the pair of field effect transistors of FIGS. 2A and 2B during different sequential stages of fabrication using the method of the present invention.

FIGS. 9C and 10C are top views of the structures shown in FIGS. 9A and 10A, respectively.

FIGS. 12A–16A and FIGS. 12B–16B are mutually orthogonal cross-sectional representations of a field effect transistor during sequential stages of fabrication utilizing some alternative process steps in accordance with the present invention.

FIGS. 17A–19A and FIGS. 17B–19B are mutually orthogonal cross-sectional representations of a field effect transistor during sequential stages of fabrication using some alternative process steps in accordance with the present invention.

DETAILED DESCRIPTION

FIGS. 2A and 2B show mutually orthogonal cross-sectional views of a pair of low current, field effect, silicon gate devices embodying the principles of the present invention. As shown in FIG. 2A, the cross-sectional view depicted in FIG. 2B is taken along the lines B—B. Correspondingly, the cross-sectional view of FIG. 2A is taken along the lines A—A in FIG. 2B.

These mutually orthogonal cross-sectional representations show an overall monolithic structure 10 comprising two silicon gate field effect transistors referred to in FIG. 2B generally as 10A and 10B. The overall monolithic structure 10 includes a substrate 11 of a selected conductivity-type (for purposes of this example a substrate of p-type conductivity will be assumed so that n-channel IGFET devices are formed.) Within spaced, surface adjacent regions of substrate 11, source and drain regions 12A and 13A for device 10A are formed. These source and drain regions are formed by doping the p-type substrate 11 with an n-type dopant such as phosphorus. A thick insulating layer 16, typically silicon dioxide, is formed on the surface of substrate 11 except in the active device region. This thick field oxide electrically isolates the devices 10A and 10B from adjacent pairs of devices on the substrate. The substrate region under the thick field oxide 16 may also be doped with a p-type impurity such as boron to assist in preventing the formation of parasitic transistor channels in the field region.

A gate insulator layer 18, typically silicon dioxide, overlies the channel region between source and drain regions 12A and 13A. As shown in FIG. 2B a central portion 27 of the channel region is quite heavily doped with p-type material such as boron to form a p+ region. Flanking the p+ region 27 are two narrow channel regions 28A and 28B which are lightly doped with n-type material such as phosphorus. Thus in this exemplary embodiment, narrow depletion-type channels are formed on opposite sides of a central enhancement section 27. Formed on top of the gate insulator layer 18 and over the narrow depletion channel 28A is a gate electrode 19A. Formed over the narrow depletion channel 28B is a gate electrode 19B. Electrodes 19A and 19B are conventionally formed of polycrystalline silicon (polysilicon) which is generally doped to be highly conductive. An insulating layer 20, conventionally deposited silicon dioxide, isolates the silicon gate electrodes 19A and 19B from each other. Metal contacts 21A and 21B are shown contacting the silicon gate electrodes 19A and 19B, respectively, through apertures in insulating layer 20. At some location on an integrated circuit chip, electrical connections (not shown) would be made to gate contacts 21A and 21B and to source and drain regions of each of the devices 10A and 10B. A further layer of insulating material 22 (typically deposited silicon dioxide) is formed over the entire structure for passivation and to isolate the various metal conductors on the chip from each other.

The device structures shown in FIGS. 2A and 2B assume a process involving a single polysilicon layer and a single metal layer. It will be apparent to those skilled in the art that other processes involving two layers of polysilicon and one or more layers of metal could also be employed utilizing the general principles of this invention. While an exemplary embodiment involving n-channel device technology and narrow channel depletion IGFET devices is illustrated, it should be apparent that the invention could also be applied to p-channel devices. Moreover, the formation of narrow channel, enhancement IGFET devices of either the p- or n-channel type is also within the general concept of this invention. Finally, insulated gate structures not of a transistor-type, such as CCD structures could also be formed in accordance with this invention.

FIGS. 2A and 2B thus show two silicon gate depletion transistor devices 10A and 10B formed in a single active device well which is defined by the edges of field oxide 16. This pair of narrow channel, depletion mode devices can be utilized as very low current load devices in numerous applications in integrated circuit technology. The pair of low current, depletion mode devices would find particularly useful application as depletion load devices in static random access memory circuits.

The monolithic structure of a pair of IGFET devices depicted in FIGS. 2A and 2B can be produced in accordance with the exemplary process depicted in FIGS. 3A–11A and 3B–11B with reference also to FIGS. 9C and 10C. The series of FIGS. 3A–11A represents cross-sectional views taken along the line A—A in FIG. 2B (and also A—A in FIGS. 3B, 9C, and 10C) as the device topology is built up. The series of FIGS. 3B–11B are cross-sectional views of progressive device topology taken along the line B—B in FIG. 2A (and also B—B in FIGS. 3A, 9C and 10C). These mutually orthogonal views illustrate how two low current IGFET devices are formed in accordance with this invention in a single oxide well on a semiconductor substrate 11. The exemplary process shown is a modification of the conventional silicon gate process with which those skilled in this art are thoroughly familiar.

FIGS. 3A and 3B depict the stage of the process whereat the active device region 50 has been defined and a thick oxide layer 16 has been grown on field regions of the substrate. In accordance with a conventional silicon gate process this structure is typically formed in this manner. First, a silicon dioxide layer 31 is formed over all of substrate 11. Then a silicon nitride layer 32 is formed on oxide layer 31. The nitride and oxide layers are patterned using conventional photolithography to leave the nitride and oxide layers in active device regions of the semiconductor substrate 11. Thereafter a thick field oxide 16 is grown on the substrate, typically using a conventional wet oxidation. The substrate outside the active device region 50 may be implanted with p-type impurities (e.g. boron) prior to growing thick field oxide 16 to assist in preventing the formation of parasitic transistor channels in the substrate under the thick field oxide 16.

FIGS. 4A and 4B depict the topology after nitride layer 32 has been etched away in the active device region 50. As shown in FIG. 4B the edges 33 of field oxide 16 form a mask of width $W_1$. Utilizing the mask thus defined, an enhancement type implant is performed as shown in FIGS. 5A and 5B to form an enhancement section 27 in substrate 11. This can be done by an ion implantation process utilizing a p-type impurity such as boron. The exemplary boron ion beam is schematically represented by the arrows designated 40 in FIGS. 5A and 5B. This boron implantation can be done into the substrate after removing oxide 31 or, preferably, can be done through a barrier layer such as the oxide 31.

The next step in the exemplary process is to enlarge the active device region 50 by removing a small amount of oxide at the edges 33 thereof, producing edges 34 and forming a mask aperture of width $W_2$ shown in FIG. 6B. This can be done in accordance with the process disclosed in the above-referenced Jones et al. patent by a time-controlled etching which removes only a slight portion of the edges of the field oxide 16, exposing a narrow section of the substrate flanking all sides of the enhancement section 27. Since the field oxide 16 etches at a known rate in a known etchant, the difference between mask aperture widths $W_2$ and $W_1$ can be very accurately controlled by controlling the etching time.

For a detailed description of an exemplary process for accomplishing this step, reference is made to the disclosure of the above-referenced Jones et al. patent and that disclosure is specifically incorporated by reference.

With the edges of the field oxide removed to expose a small additional area of the substrate, the substrate may now be doped with n-type material to form a pair of narrow depletion channels 28A and 28B on opposite sides of enhancement section 27 as depicted in FIG. 7B. This step may be performed utilizing an ion implantation process with a beam 41 of phosphorus ions. At this point in the process, two very narrow depletion channels have been formed in accordance with the teachings of the above-referenced Jones et al. patent. In accordance with this invention, the process now diverges from the process set forth in the Jones et al. patent by forming two separate insulated gate structures over the two narrow depletion channels 28A and 28B, rather than forming a single insulated gate structure over both narrow depletion channels and the central enhancement section. While the Jones et al. process has been used here as an exemplary approach to forming the two narrow channel regions, it should be apparent that the method of the above-referenced Sefick et al. patent could be substituted to achieve essentially the same structure.

In FIGS. 8A and 8B the structure is depicted after a gate oxide layer 18 has been grown and a polysilicon layer 19 has been deposited and doped to make it sufficiently conductive. The next step, as depicted in FIGS. 9A and 9B, is to form a photoresist mask 36 over polysilicon layer 19 and to use mask 36 to form, in a partial manner, two separate gate electrode structures 19A and 19B, each overlying one of the narrow depletion channels 28A and 28B. Referring to the top view shown in FIG. 9C it will be seen that the structure at this point comprises a pair of strips of polysilicon 19A and 19B covering the narrow channel depletion regions 28A and 28B. The boundaries of the narrow depletion channel 28A are identified in FIG. 9C by lead lines from reference numeral 28A at the top of the figure pointing to two dashed lines. Correspondingly, the edges of depletion channel 28B are identified at the bottom of the figure. The edges of the enhancement section 27 are identified by the lead lines from reference numeral 27. The edges of gate electrode 19A are identified with that numeral, and the edges of gate electrode 19B are identified with that numeral. For purposes of clarity the directions of cross-sectional views A—A and B—B are also illustrated on FIG. 9C.

To form a completed field effect transistor device it is subsequently necessary to form source and drain regions in substrate 11. The next step thus is to remove the photoresist mask 36 and to form a photoresist mask 37 as shown in FIGS. 10A, 10B and 10C. Utilizing this second photoresist mask, the polysilicon and, optionally, the gate oxide are etched to complete the formation of the two separate gate electrodes 19A and 19B and to define source and drain mask apertures 44 and 45. Referring to FIG. 10C, the top view of the resulting structure is shown in order to provide an orientation as to the overall topology of the structure at this point in the process. It should be noted that the second photoresist mask 37 covers the entire surface except the source and drain apertures, including the space between gate electrode 19A and 19B. At this point source and drain regions 12 and 13 can be formed for each device. Preferably this is done in an ion implantation process utilizing a beam 43 of n-type material such as phosphorus as shown in FIGS. 11A and 11B. By retaining the second photoresist mask 37 on the wafer during the implantation of the source and drain regions 12 and 13, the region of the substrate between the edges of gate electrodes 19A and 19B is not doped. This eliminates any possibility of a short between the source and drain region of each of the field effect transistor devices 10A and 10B.

In the process just described, polysilicon layer 19 is doped right after it is deposited, because portions of gate electrode 19A and 19B formed from that layer are covered by photoresist layer 37 during implantation of source and drain regions 12 and 13. This initial doping of polysilicon layer 19 would not be required if the gate electrodes 19A and 19B could be doped simultaneously with the source and drain regions 12 and 13. Referring to FIGS. 10A and 10B, if the gate oxide layer 18 between gate electrodes 19A and 19B would serve as a sufficient diffusion mask, then as an alternative, photoresist layer 37 could be removed and simultaneous doping of source, drain and gate elements could be accomplished in a furnace diffusion operation. It may be, however, that the gate oxide layer 18 itself would not be a sufficient diffusion mask and leakage paths between source and drain regions of each device and between devices might occur. In any event, the gate oxide layer 18 would not mask the substrate sufficiently during an ion implantation of source and drain regions.

FIGS. 12A–16B and 12B–16B depict an alternative process for forming the pair of silicon gate structures overlying the narrow device channels 28A and 28B. This alternative process enables a simultaneous diffusion of source and drain regions and the gate electrodes by providing a thicker oxide layer 52 (shown in FIG. 14B) between the silicon gate electrodes 19A and 19B. This thicker oxide precludes any diffusion of dopant material into the substrate in the central enhancement channel section 27 during the source and drain diffusion step depicted in FIGS. 16A and 16B.

This alternative process begins at the stage of forming the pair of transistor structures corresponding to FIGS. 8A and 8B in the exemplary process previously set forth. At this point, as shown in FIG. 12B, the central enhancement section 27 has been formed as have the two narrow channel depletion regions 28A and 28B. As the next step, an oxide layer 18 is grown over the channel portion of the substrate, a layer of polysilicon 19 is deposited over the wafer, and a silicon nitride layer 51 is deposited on top of the polysilicon.

As shown in FIGS. 13A and 13B the next sequence of steps is to form a first photoresist mask 36 and to etch the silicon nitride layer 51 and the polysilicon layer 19 to form partially two separate gate electrode structures 19A and 19B. FIG. 13B shows the cross-section through the channel region showing the edges of the gate electrodes having been formed at this point.

Referring to FIGS. 14A and 14B, the next steps are to remove the photoresist mask layer 36 and grow a thicker oxide layer 52 (FIG. 14B) between the gate electrode members 19A and 19B, the silicon nitride layer 51 on top of gate electrodes 19A and 19B preventing oxide growth thereon. Referring to FIGS. 15A and 15B, the next step is to remove the silicon nitride layer 51 by etching with a selective etchant after which a second photoresist mask 37 is formed on the wafer to define the source and drain region apertures 44A and 45A. Next, the polysilicon layer 19A and the gate oxide layer 18 are etched where exposed by the second photoresist mask pattern to form the source and drain apertures 44 and 45. Finally, as depicted in FIGS. 16A and 16B, the second photoresist mask 37 is removed, and the source and drain regions 12A and 13A in substrate 11 are doped simultaneously with polysilicon layer 19 and, particularly, gate electrode structures 19A and 19B in a furnace diffusion step. The thick oxide region 52 between gate electrodes 19A and 19B precludes diffusion of the n-type doping material (for example, phosphorus) into the channel region where the enhancement section 27 has previously been formed. This precludes forming any heavily doped region in the substrate which might short between source and drain regions at the ends of the narrow channel regions 28A and 28B. Instead of a furnace diffusion operation, an ion implantation step could be employed since thick oxide region 52 would preclude phosphorus ions from reaching the substrate thereunder in any substantial quantity.

FIGS. 17A–19A and 17B–19B depict an alternative process of forming a pair of silicon gate structures overlying the narrow device channels 28A and 28B. This alternative process enables the production of a pair of devices having gate electrodes of a width more narrow than conventional photolithographic feature size such as is illustrated in FIG. 1C. This alternative process utilizes special method steps, alternative ones of which are set forth in Owen U.S. Pat. No. 4,026,740 and Nicholas U.S. Pat. No. 4,124,933, the disclosures of each of these patents herein being incorporated specifically by reference.

As shown in FIGS. 17A and 17B this alternative process proceeds from the process steps shown in FIGS. 12A and 12B discussed above, wherein a layer of silicon nitride 51 has been deposited on a deposited layer of polysilicon. In this case a photoresist mask 55 is used to define an intermediate gate electrode structure which covers both narrow channel regions 28A and 28B. Photoresist mask 55 is used to etch nitride layer 51 and polysilicon layer 19 to form this intermediate gate electrode structure as shown in FIG. 17B.

The next step is to remove photoresist mask 55 and thereafter to diffuse boron dopant laterally into polysilicon layer 19 to form doped regions 19C and 19D therein and an undoped region 19E. Diffusion of the boron dopant is accomplished in a furnace operation and the dopant is diffused laterally to an extent sufficient to insure that the doped polysilicon region covers both of the narrow channel regions 28A and 28B in the substrate. This results in the structure depicted in FIG. 18B.

Following the lateral diffusion of the dopant, nitride layer 51 is removed and the undoped polysilicon region 19E is etched away to form (partially) two gate electrode structures 19C and 19D which have already been doped with boron. The etchants utilized to preferentially etch the undoped polysilicon and to leave the doped polysilicon can be either of those set forth in the above-referenced prior art patents. The structure shown in FIG. 19B is the result of these method steps.

From this point on the process would proceed in accordance with the steps shown in FIGS. 10A and 10B and 11A and 11B discussed above.

The above descriptions of structures and processes in accordance with this invention are given by way of example only and it should be apparent that numerous modifications could be made therein within the general principles of this invention. The examples given above relate to the formation of a pair of narrow depletion channels flanking a central enhancement section in the channel region in order to form a pair of low current depletion transistors. The particular transistors are n-channel silicon gate transistors. It should be apparent that the invention is equally applicable to the formation of a pair of narrow channel, low current enhancement transistors by using a light implant of a dopant such as boron in place of the phosphorus dopant in the narrow channel regions 28A and 28B. Furthermore, it should be apparent that the invention is not limited to producing narrow channel devices with width of 0.05 to 0.1 micron as would be desired for low current depletion load devices, but could be used to form IGFET devices having any desired channel width less than conventional photolithographic feature size.

It should further be understood that the exemplary processes described above could be employed in overall IC manufacturing processes wherein both depletion and enhancement type devices are formed on the same substrate. Some modification of the exemplary process steps disclosed above would be required in order to provide an overall process with that capability. For example, in the process depicted in FIGS. 3A–11A and 3B–11B, it would be necessary to mask those active device regions in the substrate which are intended to have enhancement devices formed therein while pursuing the steps of forming the narrow depletion channels of the depletion devices. This could be accomplished by forming a photoresist mask on the substrate after the steps depicted in FIGS. 4A and 4B, so that the operation as depicted in FIGS. 5A and 5B through FIGS. 7A and 7B could be carried out only on the devices intended to be low current depletion devices. The remainder of the process steps could be essentially common to the formation of the gate electrode structures and source and drain regions for both depletion and enhancement devices.

It should also be apparent to those with skill in this art that the principles of this invention are applicable to any field effect transistor technology utilizing any gate insulators structure. For example, instead of using a single gate insulator layer of silicon dioxide, a composite layer of silicon dioxide and silicon nitride could be employed. Furthermore, other known gate insulator materials such as aluminum oxide could be employed in devices according to this invention.

Numerous other variations of the invention are also possible. For example, by appropriate additional masking techniques, a pair of field effect transistors, one having a narrow depletion channel and one having a narrow enhancement channel could be formed instead of two separate transistors of the same type. This could be accomplished by separately masking the two narrow channel regions and implanting only one at a time with appropriate dopants.

What has been described then is a monolithic semiconductor structure in which two narrow channel, low current IGFET devices have been simultaneously formed on a semiconductor substrate. Exemplary alternative methods for forming such devices have also been set forth. The structure and method of this invention has the advantage of producing a pair of side-by-side devices in a much smaller area of the semiconductor substrate than is possible by the employment of techniques shown in the prior art.

We claim:

1. A method of forming a pair of narrow channel conductor-insulator-semiconductor devices on a semiconductor substrate of selected conductivity-type comprising:

forming in said substrate a pair of narrow channel regions on opposite sides of a central region doped with impurities of said selected conductivity-type; and forming on said substrate a pair of separate conductor-insulator gate structures each overlying one of said narrow channel regions.

2. The method of claim 1 further comprising the step of forming in said substrate a pair of source and drain regions of conductivity-type opposite to said selected conductivity-type at the ends of said narrow channel regions to produce a pair of low current CIS transistors.

3. The method of claim 2 wherein the steps of forming said pair of gate structures and forming said source and drain regions comprise:

forming a layer of insulating material on said substrate overlying said narrow channel regions;

forming a patterned layer of conductive material on said insulating material in the form of strips each overlying one of said narrow channel regions;

forming a patterned layer of masking material on said layer of conductive material to define end boundaries of said pair of gate electrodes and apertures for said source and drain regions;

removing at least said layer of conductive material exposed through said patterned layer of masking material; and implanting ions of opposite conductivity-type into said substrate to form said source and drain regions using said patterned layers of masking material as a mask.

4. The method of claim 2 wherein the steps of forming said pair of gate structures and forming said source and drain regions comprise:

forming a gate insulator layer overlying said narrow channel regions;

forming a layer of semiconductive material on said gate insulator layer;

forming a layer of silicon nitride on said layer of semiconductive material;

selectively removing portions of said silicon nitride and said semiconductive material to form separate strips thereof overlying said narrow channel regions;

growing a relatively thick silicon oxide layer on said substrate in the region between said strips;

selectively removing said nitride layer;

selectively removing portions of at least said semiconductive material to complete the formation of said pair of gate structures and to define a mask pattern for source and drain regions in said substrate; and doping simultaneously said semiconductive material and said source and drain regions of said substrate.

5. The method of claim 1, wherein the step of forming said pair of separate conductor-insulator gate structures each overlying one of said narrow channel regions comprises the steps of:

forming a layer of insulating material on said substrate overlying said narrow channel regions;

forming a layer of semiconductive material on said layer of insulating material;

forming a diffusion mask element on said semiconductive material to define an intermediate gate structure overlying both of said narrow channel regions;

laterally diffusing a selected dopant into said layer of semiconductive material underneath said diffusion mask barrier to form doped regions in said semiconductive material overlying said narrow channel regions in said substrate and separated from each other by a central undoped region of said semiconductive material;

selectively removing said diffusion masking element; and subjecting said semiconductive material to an etchant which preferentially etches said undoped region thereof to form a pair of narrow doped semiconductive elements overlying said narrow channel regions.

* * * * *